(12) United States Patent
Kohama et al.

(10) Patent No.: US 6,412,701 B1
(45) Date of Patent: Jul. 2, 2002

(54) FLEXIBLE IC MODULE AND METHOD OF ITS MANUFACTURE, AND METHOD OF MANUFACTURING INFORMATION CARRIER COMPRISING FLEXIBLE IC MODULE

(75) Inventors: Kyouichi Kohama, Toride; Yusuke Hirai, Ibaraki; Kaname Tamada, Toride; Toshinobu Sueyoshi; Ryuzo Fukao, both of Ibaraki; Kazuhiko Daido, Toride, all of (JP)

(73) Assignee: Hitachi Maxell, Ltd., Osaka (JP)

( * ) Notice: Subject to any disclaimer, the term of this patent is extended or adjusted under 35 U.S.C. 154(b) by 0 days.

(21) Appl. No.: 09/214,436

(22) PCT Filed: May 18, 1998

(86) PCT No.: PCT/JP98/02180

§ 371 (c)(1),
(2), (4) Date: Jan. 5, 1999

(87) PCT Pub. No.: WO98/52772

PCT Pub. Date: Nov. 26, 1998

(30) Foreign Application Priority Data

| May 19, 1997 | (JP) | 9-128612 |
| Jun. 20, 1997 | (JP) | 9-163614 |
| Jan. 16, 1998 | (JP) | 10-006714 |

(51) Int. Cl.$^7$ .............................................. G06K 19/02
(52) U.S. Cl. ....................................... 235/488; 235/492
(58) Field of Search ................................. 235/488, 486, 235/487, 492; 156/47, 89.12, 268

(56) References Cited

U.S. PATENT DOCUMENTS

| 4,889,980 | A | * | 12/1989 | Hara et al. ................ 235/488 |
| 4,890,197 | A | * | 12/1989 | Banjo et al. ............... 361/392 |
| 4,931,853 | A | * | 6/1990 | Ohuchi et al. ............. 357/74 |
| 4,990,759 | A | * | 2/1991 | Gloton et al. ............. 235/492 |
| 4,997,791 | A | * | 3/1991 | Ohuchi et al. ............. 437/209 |
| 5,018,051 | A | * | 5/1991 | Yamada et al. ............ 361/393 |
| 5,048,179 | A | * | 9/1991 | Shindo et al. ............. 29/840 |
| 5,121,294 | A | * | 6/1992 | Sakamoto ................ 361/394 |
| 5,134,773 | A | * | 8/1992 | LeMaire et al. .......... 29/827 |
| 5,173,840 | A | * | 12/1992 | Kodai et al. .............. 361/395 |
| 5,184,209 | A | * | 2/1993 | Kodai et al. .............. 257/679 |
| 5,192,682 | A | * | 3/1993 | Kodai et al. .............. 437/219 |

(List continued on next page.)

FOREIGN PATENT DOCUMENTS

| JP | A55-40026 | 3/1980 |
| JP | A8-287208 | 11/1996 |
| JP | A9-286189 | 11/1997 |
| JP | A10-67194 | 3/1998 |

*Primary Examiner*—Karl D. Frech
*Assistant Examiner*—Daniel St. Cyr
(74) *Attorney, Agent, or Firm*—Birch, Stewart, Kolasch & Birch, LLP

(57) ABSTRACT

There is a flexible IC module utilizable for the production of contactless IC cards and a method for producing an information carrier using the flexible IC module. An IC chip 1 and a coil 2 are embedded in a flexible substrate 3 comprising a nonwoven fabric or the like having compressibility in the thickness direction, self-pressure bonding property and resin impregnation property. This flexible IC module is produced in the following procedure. ① A first nonwoven fabric 12 having compressibility in the thickness direction, self-pressure bonding property and resin impregnation property is placed on a bottom force 11. ② An IC chip and a coil are placed on the first nonwoven fabric after positioning them. ③ A second nonwoven fabric 13 is superposed on the IC chip and coil. ④ A top force 14 is pressed onto the second nonwoven fabric, and the first and second nonwoven fabrics, the IC chip and the coil are integrated by hot pressing.

19 Claims, 9 Drawing Sheets

1 : IC CHIP
2 : COIL
3 : FLEXIBLE SUBSTRATE

U.S. PATENT DOCUMENTS

| | | | | |
|---|---|---|---|---|
| 5,208,450 A | * | 5/1993 | Uenishi et al. | 235/492 |
| 5,232,532 A | * | 8/1993 | Hori | 156/163 |
| 5,244,840 A | * | 9/1993 | Kodai et al. | 437/214 |
| 5,250,341 A | * | 10/1993 | Kobayashi et al. | 428/137 |
| 5,335,145 A | * | 8/1994 | Kusui | 361/737 |
| 5,346,576 A | * | 9/1994 | Kobayashi et al. | 156/293 |
| 5,387,306 A | * | 2/1995 | Jarvis | 156/292 |
| 5,480,842 A | * | 1/1996 | Clifton et al. | 437/226 |
| 5,510,074 A | * | 4/1996 | Rose | 264/261 |
| 5,585,618 A | * | 12/1996 | Droz | 235/492 |
| 5,671,525 A | * | 9/1997 | Fidalgo | 29/600 |
| 5,725,819 A | * | 3/1998 | Onishi et al. | 264/161 |
| 5,837,992 A | * | 11/1998 | Onozawa | 235/488 |
| 5,852,289 A | * | 12/1998 | Masahiko | 235/492 |
| 5,876,536 A | * | 3/1999 | Kumar et al. | 156/89.11 |
| 5,952,713 A | * | 9/1999 | Takahira et al. | 257/679 |
| 5,955,021 A | * | 9/1999 | Tiffany, III | 264/272.15 |
| 5,969,951 A | * | 10/1999 | Fischer et al. | 361/737 |
| 5,996,897 A | * | 12/1999 | Prancz | 235/492 |
| 6,019,284 A | * | 2/2000 | Freeman et al. | 235/380 |
| 6,025,054 A | * | 2/2000 | Tiffany, III | 428/189 |
| 6,036,099 A | * | 3/2000 | Leighton | 235/488 |
| 6,036,797 A | * | 3/2000 | Kanazawa et al. | 156/82 |
| 6,066,231 A | * | 5/2000 | Maestri et al. | 156/379.8 |
| 6,073,856 A | * | 6/2000 | Takahashi | 235/492 |

* cited by examiner

1 : IC CHIP
2 : COIL
3 : FLEXIBLE SUBSTRATE

11 : BOTTOM FORCE
12 : THE FIRST NONWOVEN FABLIC
13 : THE SECOND NONWOVEN FABRIC
14 : TOP FORCE

FLEXIBLE IC MODULE AND METHOD OF ITS MANUFACTURE, AND METHOD OF MANUFACTURING INFORMATION CARRIER COMPRISING FLEXIBLE IC MODULE

This application is the national phase under 35 U.S.C. §371 of prior PCT International Application No. PCT/JP98/02180 which has an International filing date of May 18, 1998 which designated the United States of America.

The present invention relates to a flexible IC module which is a basis for information carriers such as contactless IC cards, a method for producing the flexible IC module, and a method for producing information carriers using the flexible IC module.

BACKGROUND ART

Use of contactless information carriers such as contactless IC cards as substitutes for commutation tickets, driver's licenses, telephone cards and cash cards has been investigated, and since extensive use thereof has been expected, one of the most important technical tasks is how to simplify the production steps and reduce the unit cost.

Hitherto, as a method for producing contactless IC cards, there has been known a method which comprises boring holes through a reinforcing material made of glass fiber or the like, storing an IC chip and a coil which is a contactless signal transmission means in the hole, then sealing the hole with a resin to form a substrate, and finally applying cover sheets to the front and back sides of the substrate to obtain the desired contactless IC cards.

According to this method, contactless IC cards in which the position of the coil set in the substrate is accurately regulated can be produced by adjusting the size of the bored hole to a suitable size depending on the size of the coil. Thus, transfer of power and signal between the IC card and the external devices can be performed highly efficiently.

As another method, as disclosed in, for example, NIKKEI MECHANICAL 1997. 1.6, No.497, pp.16–17, a method is proposed which comprises disposing a first resin sheet to which an IC chip and a coil as a contactless data transmission means are bonded and a second resin sheet having no such IC chip and coil at facing portions of a stationary mold and a movable mold of an injection molding machine, respectively, putting the molds together, and then filling a cavity with a resin whereby a contactless IC card comprising the first and second resin sheets, the IC chip and the coil which are integrated with the filling resin is obtained.

According to this method, since a contactless IC card having resin sheets (cover sheets) bonded to the front and back sides can be obtained by injection molding, the contactless IC card can be more efficiently produced and the production cost can be reduced as compared with the conventional method according to which a substrate in which IC chip and coil are embedded is cured and thereafter cover sheets are bonded to the front and back sides of the substrate.

On the other hand, as for the connection of IC chip and coil mounted on the contactless IC card, generally is employed a method of mounting the IC chip on a wiring substrate and connecting the coil to an electrode terminal formed on the wiring substrate.

This method has been technically established and hence the IC chip and the wiring substrate, and the wiring substrate and the coil can be connected with a high reliability.

However, in the former method of the above-mentioned conventional methods for the production of contactless IC cards, IC chip and coil are stored in a hole bored in a reinforcing material, and then inside and outside of the hole are cured with resin. Therefore, the inside of the hole having no reinforcing material is low in strength, and stress is concentrated at the inside of the hole and the substrate is apt to be broken when an improper external force such as bending is applied.

Furthermore, since sealing of the hole with resin and impregnation of the reinforcing material with resin and curing of the reinforcing material must be carried out after the IC chip and the coil are accurately set in the reinforcing material in which the desired hole is bored, the production steps are complicated and cheap information carriers can hardly be produced. Especially, when various contactless IC cards are produced on the same line, various reinforcing materials differing in the size of the holes depending on the size of the IC chip and the coil stored therein. Thus, the production steps are further complicated, resulting in increase of the production cost of contactless IC cards.

On the other hand, since the latter method of the above-mentioned conventional methods for the production of contactless IC cards carries out injection molding with a cover sheet having an IC chip and a coil which are bonded thereto being disposed on one of the molds, a molten resin of high temperature contacts with the portions of the cover sheet to which an adhesive is applied and not applied. Therefore, it has been found that owing to the difference in coefficient of thermal expansion of the portions to which the adhesive is applied and not applied, wrinkles are apt to be formed at the boundary of these portions. According to experiments, it was difficult to produce contactless IC cards having no wrinkles on the cover sheets even when resin temperature, injection speed and injection pressure were variously changed.

Since contactless IC cards are handled by fingers and directly viewed, those having wrinkles on the surface are not good in hand and appearance and lose commercial value. Furthermore, in case the surface of the cover sheet is printed after the production of contactless IC cards, it is impossible to perform beautiful printing on the surface of the cards and they also have no commercial value.

Moreover, the conventional connection method of IC chip and coil requires a wiring substrate as an essential constitutive element. Therefore, it needs a high cost, and it is difficult to make thinner and flexible the contact less IC cards.

The present invention has solved these problems, and the objects of the present invention are to provide a construction of a flexible IC module which makes easy to produce information carriers, to provide a method for producing the flexible IC module at low cost and at high efficiency, and to provide a method for producing an information carrier superior in feeling at use and excellent in appearance at low cost and at high efficiency using the above flexible IC module.

DISCLOSURE OF INVENTION

<Construction of Flexible IC Module>

In order to solve the above problems, as for the construction of the flexible IC module, the present invention employs such construction as comprising a flexible substrate of a given shape and a given size having compressibility in the thickness direction, self-pressure bonding property and resin impregnation property and parts mounted and carried on the flexible substrate, the parts to be mounted being embedded in dents formed by compression in a portion of the flexible substrate.

The parts to be mounted can be completely embedded in the flexible substrate or can be embedded in one side of the flexible substrate ehilr being partly exposed outside. In the former case, the front and back sides of the flexible substrate are formed in a planar state, and in the latter case, the front and back sides of the flexible substrate including the surface of the embedded parts embedded are formed in a planar state.

In the present specification, a "self-pressure bonding property" means such characteristics of the flexible substrate that when a compressive force is applied to the flexible substrate at room temperature or under heating, the fibers constituting the flexible substrate are bonded or when a compressive force is applied to a plurality of stacked flexible substrates, these flexible substrates are bonded to each other, and the flexible substrate(s) are kept at the state of the volume being reduced than before application of the compressive force.

As woven fabrics, knitted fabrics or nonwoven fabrics which per se have the self-pressure bonding property, there may be used those which comprise so-called conjugate fibers each of which is composed of two or more parts differing in melting point; those which are obtained by mixed spinning two or more synthetic resins differing in melting point or which are mixtures of synthetic resin fibers differing in melting point; and those which comprise glass fibers, carbon fibers, Kepler fibers, chemical fibers, natural fibers or combination thereof, these fibers being bonded to each other with a resin binder. As woven fabrics, knitted fabrics, nonwoven fabrics or paper to which the self-pressure bonding property is imparted by impregnating them with a suitable amount of synthetic resin, there may be used those which comprise glass fibers, carbon fibers, Kepler fibers, chemical fibers, natural fibers or combination thereof. As the nonwoven fabrics, there may be used all of the nonwoven fabrics having the known structure such as, for example, those which comprise a web composed of random fibers obtained by opening synthetic resin filaments prepared by melt spinning and those which comprise a web having a fine reticulate structure made of synthetic resin fibers prepared by injecting a solution of starting polymer.

If necessary, a desired circuit pattern can be printed on the surface of the flexible substrate on which parts are mounted, and this circuit pattern can include a coil for transmission of data and/or electric source.

The parts to be mounted and carried on the flexible substrate include, for example, at least one parts selected from an IC chip, an IC module, a contactless transmission means for data and/or electric source, a condenser, a resistor, a solar battery, an image display device, an optical recording medium, an optical magnetic recording medium, a transparent code information display device formed using an infrared absorber, an infrared emitter or a phosphor, and a magnet or ferromagnet for highly accurately positioning an information carrier at the portion at which a carrier for reader-writer is set, and combination of these parts with other parts. A coil can be used as the contactless transmission means for data and/or electric source. A preferred wire for constituting the coil comprises a core wire of copper, aluminum or the like, a bonding metal layer such as gold or solder which covers the core wire, and an insulating layer such as polyurethane which covers the bonding metal layer for attaining easy connection with other electronic parts such as an IC chip.

Furthermore, when an IC chip and a coil are mounted as the parts, it is preferred to directly connect both ends of the coil to the input and output terminals of the IC chip for decreasing the thickness of the flexible IC module and reducing the cost. For the direct connection of the IC chip and the coil, wedge bonding method can be employed, but according to this method, there are the following problems: ① since the pressed portion of the coil is deformed to flat by applying ultrasonic and high pressure to the connecting portion, burnout sometimes occurs at the boundary portion between the deformed portion and the undeformed portion; ② since ultrasonic and high pressure are applied to the connecting portion, the IC chip is sometimes damaged, and especially when a thin chip of about 50–150 $\mu$m thick is used, the damage is conspicuous; ③ since the ultrasonic which requires complicated setting of conditions, control of the connecting conditions is difficult and it is difficult to produce non-defective articles stably. Therefore, it is particularly preferred to employ the soldering method or welding method which is free from these problems.

The soldering of coil to IC chip can be carried out by the method according to which an IC chip having a solder bump previously formed at the input and output terminals is used, the both ends of the coil for contactless transmission are allowed to contact with the solder bumps, then a bonding tool is pressed to the both ends of the coil and the solder bumps are molten by the energy given from the bonding tool. On the other hand, the welding of the coil to the IC chip can be carried out by a method according to which an IC chip having gold bumps previously formed at the input and output terminals is used, the both ends of the coil for contactless transmission are allowed to contact with the gold bumps, then a welding head is pressed to both ends of the coil and the gold bumps are molten by the energy given from the welding head.

The bonding tool for the soldering and the welding head for the welding which can heat the connecting metal to higher than the melting temperature are enough and those of the same construction can be used.

In the flexible IC module having the above construction, the parts to be mounted are embedded in the substrate such as nonwoven fabric, and thus the module is superior in the effect to protect the mounted parts. Moreover, since the substrate is formed of a nonwoven fabric or the like which can be impregnated with resin, the desired information carriers such as contactless IC cards and others can be produced by impregnating the substrate with resin and bonding the cover sheet by the impregnated resin. In this case, the substrate can be impregnated with the resin nearly uniformly, and hence no wrinkles are formed on the surface of the substrate and information carriers of high commercial value can be produced. Furthermore, in the IC module of the present construction, the substrate is composed of nonwoven fabric or the like which is very high in flexibility, and therefore it can be utilized not only as a constitutive part of flat information carriers, but also as an information carrier provided at the curved portion or the portion subjected to repeated deformation.

<Method for the Production of Flexible IC Module>

The methods for the production of the flexible IC module are as follows:

① A first flexible substrate and a second flexible substrate of a give shape and a given size which have compressibility in the thickness direction, self-pressure bonding property and resin impregnation property are prepared. Thereafter, the desired parts to be mounted are positioned and disposed between the first and second flexible substrates. Then, these first and second flexible substrates are compressed in the thickness direction at room temperature or under heating, thereby to integrate the first and second flexible substrates and simultaneously the parts to be mounted are embedded in the dents formed in the substrates by the application of compressive force.

② The desired parts to be mounted are positioned and disposed on one side of a flexible substrate. Thereafter, the flexible substrate is compressed in the thickness direction at room temperature or under heating and the parts to be mounted are embedded in the dents formed by the compression in the flexible substrate.

According to the above methods ① and ②, the desired flexible IC module can be obtained only by stacking the necessary materials and parts and then compressing the resulting laminate in the thickness direction at room temperature or under heating. Thus, production of flexible IC modules can be performed at a very high efficiency.

③ An IC chip is positioned and disposed on one side of a first flexible substrate. Separately, a coil is positioned and disposed on one side of a second flexible substrate, and the both ends of the coil are set at the distance set between the input and output terminals provided at the IC chip. Then, the first and second flexible substrates are superposed so that the side of the first flexible substrate on which the IC chip is disposed and the side of the second flexible substrate on which the coil is disposed face each other and the input and output terminals of the IC chip contact with the both ends of the coil. These first and second flexible substrates are compressed in the thickness direction at room temperature or under heating, thereby to integrate the first and second flexible substrates and simultaneously the IC chip and the coil are embedded in the dents formed in a portion of the first and second substrates by the application of compressive force. Furthermore, heat and pressing force are applied to the input and output terminal portions from the outer surface of the second flexible substrate provided with the coil to electrically connect the input and output terminal portions and the both end portions of the coil with each other.

④ A coil is positioned and disposed on one side of a flexible substrate of a give shape and a given size which has compressibility in the thickness direction, self-pressure bonding property and resin impregnation property, and the both ends of the coil are set at the distance set between the input and output terminals provided at an IC chip. Then, an IC chip is disposed on one side of said flexible substrate with the input and output terminals being allowed to contact with the both end portions of the coil. This flexible substrate is compressed in the thickness direction at room temperature or under heating, and the IC chip and the coil are embedded in the dents formed in the flexible substrate by the application of compressive force. Furthermore, heat and pressing force are applied to the input and output terminal portions from the outer surface of the flexible substrate provided with the coil to electrically connect the input and output terminal portions and the both end portions of the coil with each other.

According to the methods ③ and ④, an IC chip and a coil the both ends of which are directly connected to the input and output terminals of the IC chip are used as the parts to be mounted, and thus a thin IC module can be produced. Furthermore, since both end portions of the coil are previously fixed on the flexible substrate and the distance between the end portions is set to be equal to the distance set between the input and output terminals of the IC chip, the connection of the IC chip and the coil is easy and a flexible IC module can be efficiently produced.

<Method for the Production of Information Carrier>

The methods for the production of information carrier are as follows:

① The information carrier is produced by a method comprising the steps of disposing a first cover sheet and a second cover sheet at the predetermined portions of a stationary mold and a movable mold of a molding apparatus, respectively; superposing a flexible IC module on the cover sheet disposed at the stationary mold or the movable mold; closing the stationary mold and the movable mold and filling a resin in the cavity formed by the molds; and uniformly impregnating the flexible substrate with the filled resin, then opening the stationary mold and the movable mold and removing the information carrier which is the desired product.

According to this method, bonding of the parts to be mounted to the cover sheet can be omitted. Thus, the production of information carrier can be efficiently carried out and besides the heat load applied to the cover sheet at the time of filling of the resin can be uniformized, and wrinkling of the cover sheet caused by non-uniform heat load can be prevented. Accordingly, information carriers of high quality can be produced at a high efficiency and, besides, satisfactory design printing and the like can be performed. Furthermore, since the resin is filled while the parts to be mounted which are supported by the flexible substrate are present between the two cover sheets, the set position of the parts in the thickness direction of the information carrier can be optionally adjusted by adjusting the thickness of the substrate. Moreover, since the parts to be mounted are supported by the flexible substrate, the effect of protecting the parts can be enhanced. Of course, since nonwoven fabric and the like which can be impregnated with resin are used, the resin can be rapidly filled to cause no deterioration of injection molding cycle.

② The information carrier is produced by a method comprising the steps of stacking a first heat-meltable sheet, a flexible IC module and a second heat-meltable sheet in this order on an upper surface of a bottom force; pressing a top force onto the second heat-meltable sheet to compress the laminate of the flexible IC module and the first and second heat-meltable sheets in the thickness direction under heating, thereby to melt the first and second heat-meltable sheets; and impregnating the flexible IC module with the melt of the first and second heat-meltable sheets, followed by hot press molding the module to obtain an information carrier of a given thickness.

③ The information carrier is produced by a method comprising the steps of stacking a first cover sheet, a first heat-meltable sheet, a flexible IC module, a second heat-meltable sheet and a second cover sheet in this order on an upper surface of a bottom force; pressing a top force onto the second cover sheet to compress the laminate of the flexible IC module, the first and second heat-meltable sheets and the first and second cover sheets in the thickness direction under heating, thereby to melt the first and second heat-meltable sheets; and impregnating the flexible IC module with the melt of the first and second heat-meltable sheets and simultaneously bonding the first and second cover sheets by the melt, followed by hot press molding the module to obtain an information carrier of a given thickness.

④ The information carrier is produced by a method comprising the steps of drawing off from rolls the top ends of a continuous flexible IC module, a first heat-meltable sheet and a second heat-meltable sheet which are wound on the rolls; guiding the flexible IC module and the first and second heat-meltable sheets drawn off from the respective rolls to laminating rolls to laminate individually the first and second heat-meltable sheets on the front side and the back side of the flexible IC module; guiding the laminate of the flexible IC module and the first and second heat-meltable sheets to heating-pressing rolls to compress the laminate in the thickness direction under heating, thereby to melt the first and second heat-meltable sheets; and impregnating the flexible IC module with the melt of the first and second heat-meltable sheets and roll press molding the module to obtain an information carrier of a given thickness.

⑤ The information carrier is produced by a method comprising the steps of drawing off from rolls the top ends of a continuous flexible IC module, a first heat-meltable sheet, a second heat-meltable sheet, a first cover sheet and a second cover sheet which are wound on the respective rolls; guiding the flexible IC module, the first and second heat-meltable sheets and the first and second cover sheets drawn off from the respective rolls to laminating rolls to laminate individually the first and second heat-meltable sheets on the front side and the back side of the flexible IC module and to laminate individually the first and second cover sheets on the outer surfaces of the first and second heat-meltable sheets; guiding the laminate of the flexible IC module, the first and second heat-meltable sheets and the first and second cover sheets to heating-pressing rollers to compress the laminate in the thickness direction under heating, thereby to melt the first and second heat-meltable sheets; and impregnating the flexible IC module with the melt of the first and second heat-meltable sheets and simultaneously bonding the first and second cover sheets by the melt, and roll press molding the module to obtain an information carrier of a given thickness.

The methods for the production of the information carriers mentioned in the above ②–⑤ have the same effects as the preceding method, and, besides, since they carry out casing of the flexible IC module by roll pressing method, the information carriers can be produced at a very high efficiency and productivity of the information carriers can be enhanced to reduce the cost.

In the above drawings, the numeral 1 indicates an IC chip, 1a indicates input and output terminals, 1b indicates a solder bump, 1c indicates a solder, 1d indicates a gold bump, 2 indicates a coil, 2a indicates a core wire, 2b indicates an insulating layer, 2c indicates a connecting metal layer, 3 indicates a flexible substrate, 4 indicates a first heat-meltable sheet, 5 indicates a second heat-meltable sheet, 10 indicates a flexible IC module, 11 indicates a bottom force, 12 indicates a first nonwoven fabric, 13 indicates a second nonwoven fabric, 14 indicates a top force, 15 indicates a dent, 21 indicates a first intermediate, 22 indicates a second intermediate, 23 indicates a third intermediate, 24 indicates an ultrasonic vibrator, 31 indicates a first stage intermediate, 32 indicates a second stage intermediate, 33 indicates a third stage intermediate, 41 indicates a first cover sheet, 42 indicates a stationary mold, 43 indicates a second cover sheet, 44 indicates a movable mold, 45 indicates a vent hole, 46 indicates a cavity, 47 indicates a gate, 51 and 52 indicate bonding tools, 61a and 61b indicate electrodes, 62 indicates a welding head, 63a and 63b indicate reels on which a ribbon is wound, 64 indicates a high resistance tape, 65 indicates a motor, and 71–79 indicate rollers.

BEST MODE FOR CARRYING OUT THE INVENTION

Figure 1:
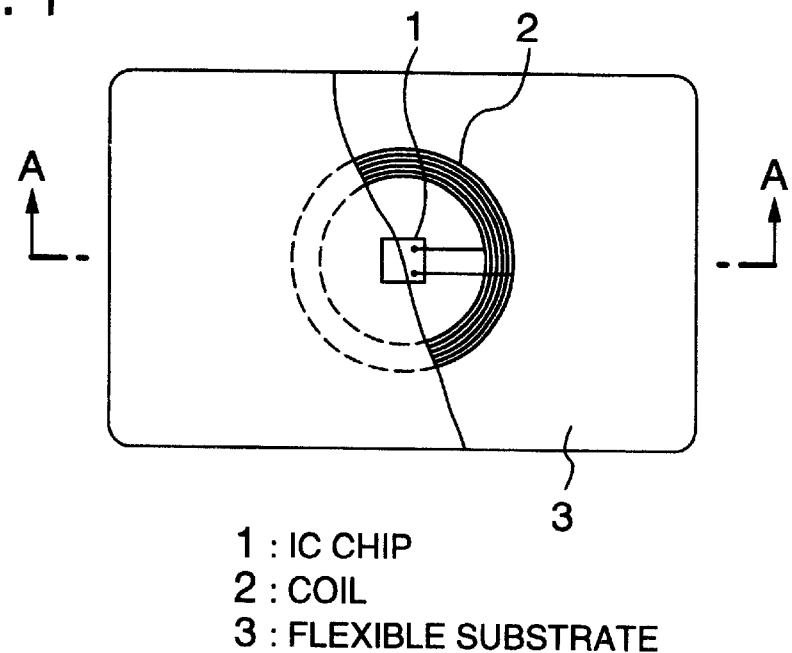
FIG. 1 is a plan view of a flexible IC module according to the first example of the present invention, shown partly cut away.
Figure 2:
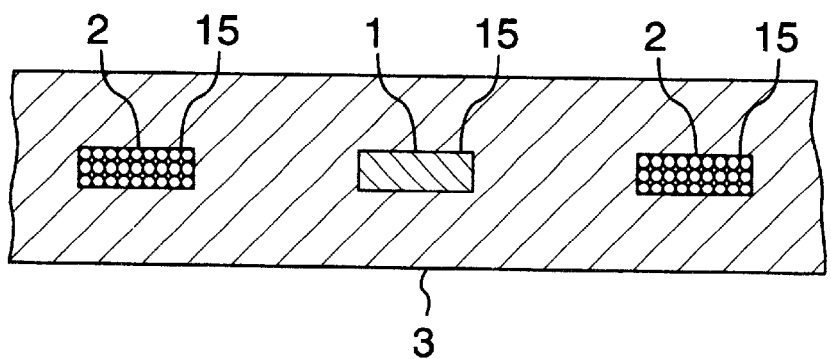
FIG. 2 is an enlarged sectional view taken on the line A—A of FIG. 1.
Figure 3:
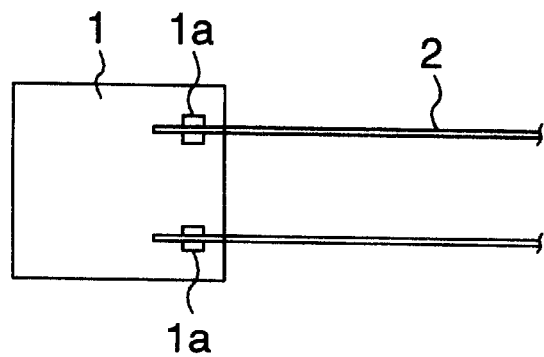
FIG. 3 is a plan view of the essential parts of an IC chip and a coil mounted on the flexible IC module according to the first example.
Figure 4A:
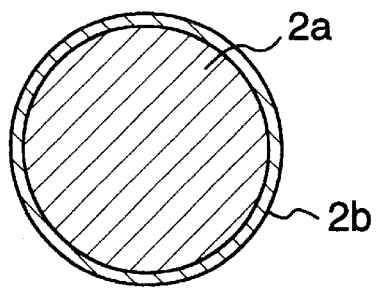
FIGS. 4A and 4B are sectional views of a wire constituting the coil.
Figure 4B:
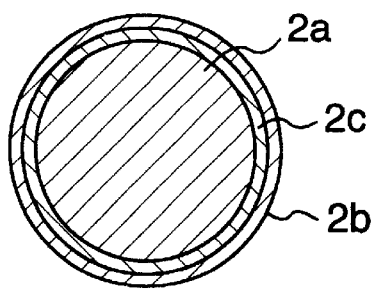
Figure 5A:
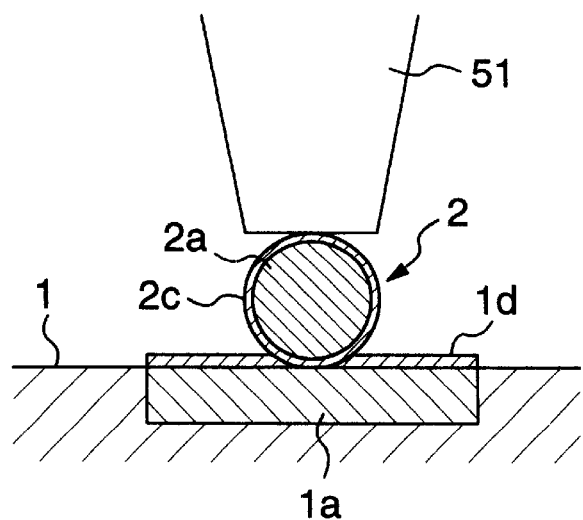
FIGS. 5A and 5B are sectional views showing a method of direct connection of IC chip and coil and the state of the connected portion.
Figure 5B:
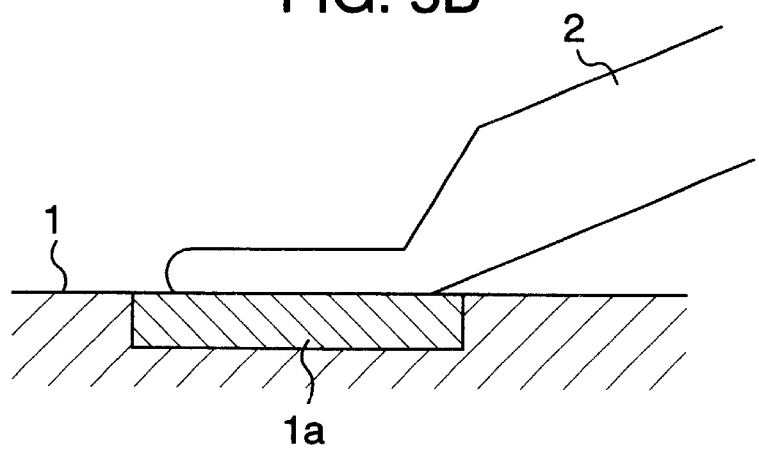
Figure 6A:
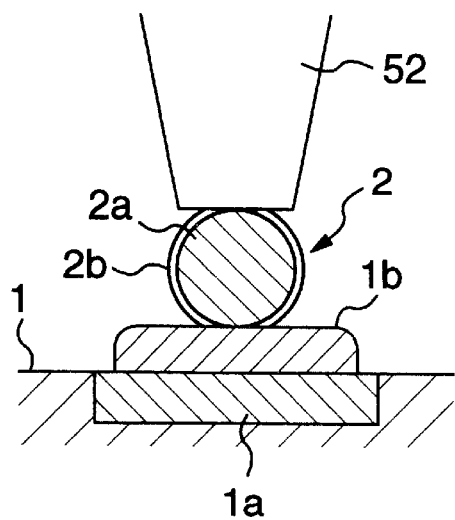
FIGS. 6A and 6B are sectional views showing another method of direct connection of IC chip and coil and the state of the connected portion.
Figure 6B:
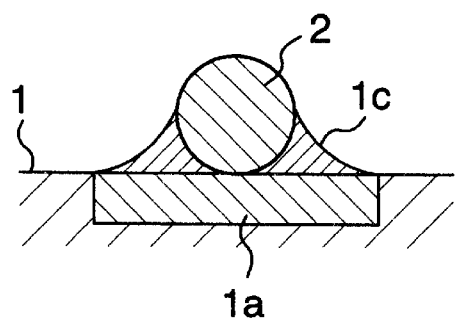
Figure 7:
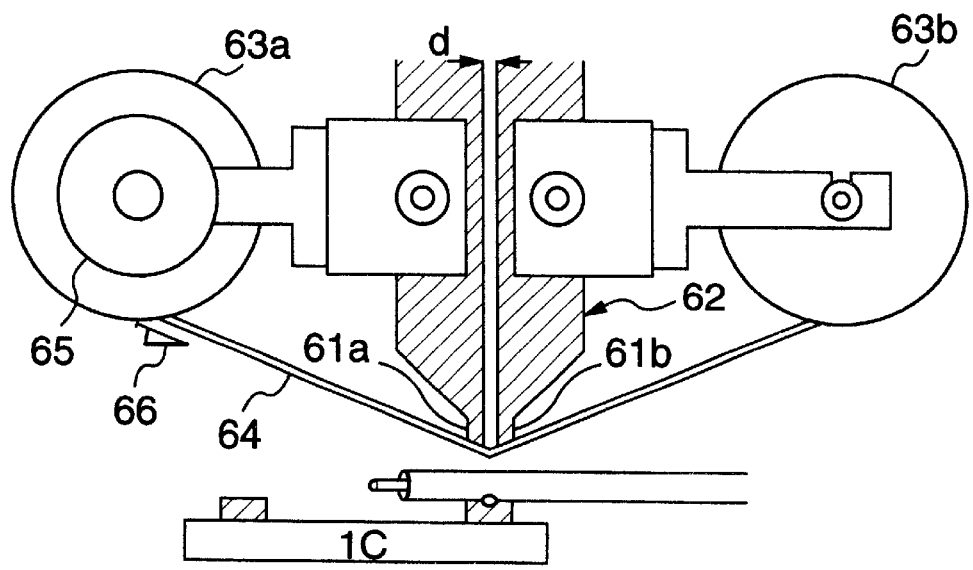
FIG. 7 shows the state of using a welding apparatus applied to the direct connection of IC chip and coil.

The first example of the flexible IC module according to the present invention will be explained referring to FIGS. 1–7. FIG. 1 is a plan view of the flexible IC module according to this example, shown partly cut away. FIG. 2 is an enlarged sectional view taken on the line A—A of FIG. 1. FIG. 3 is a plan view of the essential parts of the IC chip and the coil mounted on the flexible IC module according to the present example. FIGS. 4A and 4B are sectional views of a wire constituting the coil. FIGS. 5A and 5B are sectional views showing a method of direct connection of the IC chip and the coil and showing the state of the connected portion. FIGS. 6A and 6B are sectional views showing another method of direct connection of the IC chip and the coil and showing the state of the connected portion. FIG. 7 shows the state of using a welding apparatus applied to the direct connection of the IC chip and the coil.

As can be seen from FIGS. 1–3, the flexible IC module of this example comprises a flexible substrate 3 made of a nonwoven fabric in which an IC chip 1 and a coil 2 are completely embedded, said coil 2 being directly connected to input and output terminals (pads) 1a of the IC chip 1 and receiving, in contactless state, supply of electric source from a reader-writer (not shown) to the IC chip and carrying out, in contactless state, transmission of data from and to a reader-writer (not shown).

As the IC chip 1, optional IC chips which have been conventionally mounted on contactless IC cards can be used, but especially preferred are those which are reduced in thickness to a total thickness of about 50–150 μm in order to reduce the thickness of the contactless IC cards. Construction of the IC chip is well known and besides is not the point of the present invention, and, hence, explanation thereof will be omitted.

As for the coil 2, there may be used wires comprising a core wire 2a made of a highly conductive metallic material such as copper or aluminum and an insulating layer 2b such as a resin which covers the core wire 2a as shown in FIG. 4A. Furthermore, there may also be used wires comprising the core wire 2a, a bonding metal layer 2c such as gold or solder which covers the core wire 2a, and the insulating layer 2b which covers the bonding metal layer 2c as shown in FIG. 4B.

Diameter of the wire is 20–100 μm, and this wire is wound up several to several ten turns depending on the characteristics of the IC chip, thereby to form the coil 2.

The direct bonding of the IC chip 1 and the coil 2 is carried out especially preferably by wedge bonding, soldering or welding.

In the case of wedge bonding the IC chip 1 and the coil 2, a gold bump 1d is previously formed at input and output terminals 1a of the IC chip 1 as shown in FIG. 5A. In this case, as the coil 2, one which has no bonding metal layer 2c can be used, but particularly preferably the core wire 2a is covered with a gold layer in order to perform the bonding more easily and securely. The wedge bonding of input and output terminals 1a and coil 2 is carried out by superposing end portions of coil 2 on input and output terminals 1a and pressing a bonding tool 51 onto the coil 2 with application of ultrasonic, carbonizing the insulating layer 2b by the energy generated and simultaneously melting the gold bump as shown in FIG. 5A. Thus, as shown in FIG. 5B, the coil 2 is directly connected with the input and output terminals 1a of the IC chip 1.

In the case of soldering the IC chip 1 and the coil 2, a solder bump 1b is previously formed at input and output terminals 1a of the IC chip 1 by solder plating as shown in FIG. 6A. In this case, as the coil 2, one which has no bonding metal layer 2c can be used, but particularly preferably the core wire 2a is covered with gold or the like in order to improve wettability with solder and perform the soldering easily and securely. The soldering of input and output terminals 1a and coil 2 is carried out by superposing end portions of coil 2 on input and output terminals 1a, pressing a bonding tool 52 heated to a give temperature onto the coil 2 and carbonizing the insulating layer 2b by the energy generated and simultaneously melting the solder bump 1b as shown in FIG. 6A. Thus, as shown in FIG. 6B, the coil 2 and the input and output terminals 1a of the IC chip 1 are soldered through the solder 1c. In place of forming the solder bump 1b at the input and output terminals 1a of the IC chip 1, core wire 2a covered with a solder layer can be used as the coil 2 and the soldering can be carried out in the same manner as above. Furthermore, it is also possible to form solder bump 1b at the input and output terminals 1a of IC chip 1 and use a core wire 2a covered with a solder layer as the coil 2.

In the case of welding the IC chip 1 and the coil 2, an IC chip having a gold bump formed at the input and output terminals 1a or a coil comprising a wire composed of core wire 2a covered with a gold layer or both of these IC chip and coil can be used. As a welding machine, there may be used one which comprises a welding head 62 having two electrodes 61a and 61b arranged in parallel with each other apart at a slight distance of gap d, ribbon winding reels 63a and 63b provided at the welding head 62, a ribbon-like heating resistor 64 wound on these reels 63a and 63b and disposed so that a part of the resistor contacts with the tips of the electrodes 61a and 61b, and a motor 65 driving the drive reel 63a as shown in FIG. 7. As the ribbon-like heating resistor 64, the most preferred is a molybdenum ribbon comprising a single crystal molybdenum of high purity because it can locally generate high temperature due to its high specific resistance and thermal conductivity, and furthermore it has a high strength.

In welding, an end portion of coil 2 is directly superposed on input and output terminals 1a of IC chip 1, and the welding head 62 is pressed onto the coil 2 as shown in FIG. 7. Then, a pulse electric power is supplied to the electrodes 61a and 61b, and the insulating layer 2b is carbonized utilizing the heat generated by the ribbon-like heating resistor 64 and simultaneously the gold bump or the gold layer covering the core wire 2a, or both of them are molten. The motor 65 drives the drive reel 63a as required and a clean ribbon-like heating resistor 64 is always allowed to contact with the welding head 62. When a brush 66 for removing carbides is provided at the ribbon-like heating resistor 64, the ribbon-like heating resistor 64 can be repeatedly used and the running cost can be reduced.

The welding machine of FIG. 7 can also be utilized as a heat source for soldering in place of the bonding tool 52 shown in FIG. 6A.

As the nonwoven fabric constituting the flexible substrate 3, there may be used any known nonwoven fabrics as far as they have compressibility in the thickness direction, self-pressure bonding property and resin impregnation property. For example, those which comprise webs formed of ready-made short fibers composed of glass fibers, carbon fibers, Kepler fibers, chemical fibers, natural fibers or combination thereof can be used. In addition, there may be used non-woven fabrics in which the webs are made of the fibers directly spun from the materials for the fibers, such as those which comprise webs formed of random fibers obtained by opening melt-spun synthetic resin filaments or synthetic resin fibers having fine reticulate structure made by injecting a solution of the starting polymer. The nonwoven fabrics having webs of synthetic resin fibers can be produced by spun bonding method, melt blowing method, flash spinning method and the like. Furthermore, methods for bonding the resulting webs include thermal bonding method, latex bonding method and the like. In the case of using a nonwoven fabric having webs formed of synthetic resin fibers, the webs may be formed of a mixture of synthetic resin fibers of high melting point and those of low melting point for easy bonding of the fibers.

Of these nonwoven fabrics, those which contain a synthetic resin of low melting point as at least a part thereof and which per se have self-pressure bonding property can be used, as they are, for the flexible substrate 3. On the other hand, those which contain no synthetic resin of low melting point and which per se have no self-pressure bonding property are impregnated with a suitable amount of a resin of low melting point after making the nonwoven fabrics to impart self-pressure bonding property, and thus they can be used for the flexible substrate 3.

Thickness of the flexible substrate 3 after subjected to compression molding is set taking into consideration thickness of the final contactless IC card and thickness of the cover sheet used for the production of contactless IC card. Basically, the thickness is enough to be somewhat greater than thickness of the parts to be mounted. For example, when an IC chip 1 of 50 μm thick and a coil 2 comprising a wire having a diameter smaller than the thickness of the IC chip 1 are mounted, the thickness of flexible substrate 3 can be 70 μm or more, and when an IC chip 1 of 150 μm thick and a coil 2 comprising a wire having a diameter smaller than the thickness of the IC chip 1 are mounted, the thickness of flexible substrate 3 can be 170 μm or more.

In the case of the flexible IC module of this example, since IC chip 1 and coil 2 to be mounted are completely embedded in the substrate 3 comprising a nonwoven fabric or the like, these IC chip 1 and coil 2 are effectively protected. Furthermore, since the substrate 3 is composed of a nonwoven fabric and others having resin impregnation property, the desired contactless IC card can be produced by impregnating the substrate 3 with resin and bonding the cover sheets using this resin. In this case, the substrate can be nearly uniformly impregnated with resin. Therefore, no wrinkles are formed on the surface of the substrate, and, besides, there is no need to use a spacer sheet commonly used for uniformizing the thickness. Thus, contactless IC cards of high commercial value can be produced. Moreover, since the IC module of this construction comprises a substrate composed of a nonwoven fabric and the like and is very high in flexibility, it can be not only utilized as constitutive parts of plate-like contactless IC cards, but also applied as constitutive parts of curved portion or portion subjected to deformation repeatedly.

In addition, since the IC chip and the coil 2 are directly connected, a wiring substrate can be omitted, and thickness of the flexible IC modules and consequently the final contactless IC cards can be decreased and production cost therefor can be reduced. Especially, when soldering method or welding method is used for the direct connection of the IC chip 1 and the coil 2, the following advantages can be obtained as compared with when wedge bonding method is used. That is, the wedge bonding method is carried out by strongly pressing bonding tool 51 to coil 2 superposed on input and output terminals 1a of IC chip 1 and simultaneously applying ultrasonic emitted from the bonding tool 51 to the bonding portion to rupture insulating layer 2b by the energy and accelerate melting of gold plating layer 2d. Therefore, as shown in FIG. 5B, the tip portion of the coil 2 is deformed to flat state and breaking is apt to occur at the boundary with the undeformed portion. Furthermore, the wedge bonding method applies ultrasonic and high pressure to the connecting portion, which is apt to cause damage of IC chip, and this is conspicuous when a thin IC chip of about 50–150 μm thick is used. Moreover, since the wedge bonding method utilizes ultrasonic which is complicated in setting of conditions, maintenance and control of the connecting conditions are difficult, resulting in difficulty in stable production of non-defective products.

On the other hand, in the case of the soldering method and welding method, ultrasonic is not applied to the connecting portion and, besides, pressing force of bonding tool 52 or welding head 62 is smaller than in the wedge bonding method. Therefore, breakage of coil 2 or rupture of IC chip is not caused, and, in addition, maintenance and control of the connecting conditions are easy because ultrasonic is not utilized. When the soldering method according to the present invention is employed, since a wire comprising a core wire 2a covered with bonding metal layer 2c and insulating layer 2b is used, no oxide film is formed on the core wire 2a and hence there is no need to use a flux which is usually needed for solder connection. Thus, complication of production steps owing to the addition of a cleaning step for the flux can be avoided.

Figure 8:
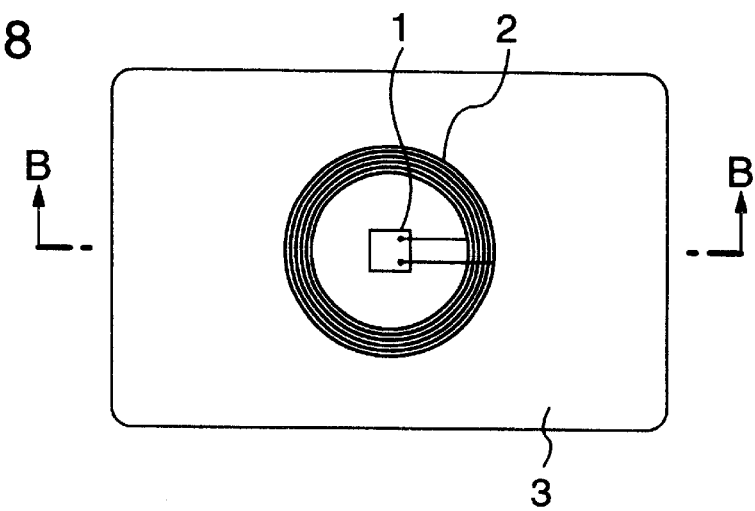
FIG. 8 is a plan view of a flexible IC module according to to second example of the present invention.

Next, the second example of the flexible IC module according to the present invention will be explained referring to FIGS. 8 and 9. FIG. 8 is a plan view of a flexible IC module of this example and FIG. 9 is an enlarged sectional view taken on the line B—B of FIG. 8.

Figure 9:
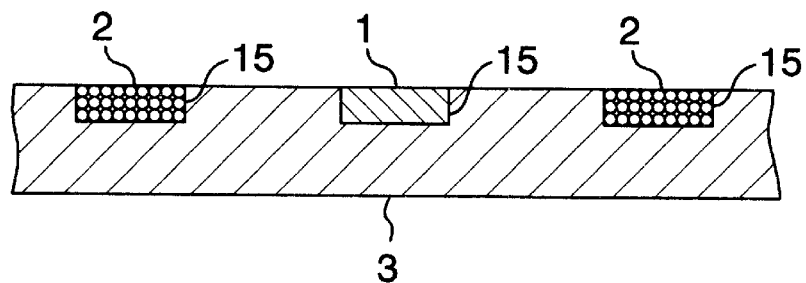
FIG. 9 is an enlarged sectional view taken on the line B—B of FIG. 8.

As is apparent from FIGS. 8 and 9, the flexible IC module of this example has such a construction that the IC chip 1 and the coil 2 directly connected to input and output terminals 1a of the IC chip 1 are embedded in one side of the flexible substrate 3 made of a nonwoven fabric. Other portions are the same as in the flexible IC module of the first example, and explanation thereof will be omitted to avoid overlapping.

The flexible IC module of this example has the same effects as of the first example and, in addition, has the merits that since IC chip 1 and coil 2 are embedded in one side of the flexible substrate 3, the module can be made thinner and the production can be further simplified, and thus it can be produced at lower cost.

Method for the production of the flexible IC module according to the present invention will be explained below.

The First Example of the Method for the Production of Flexible IC Module

Figure 10:
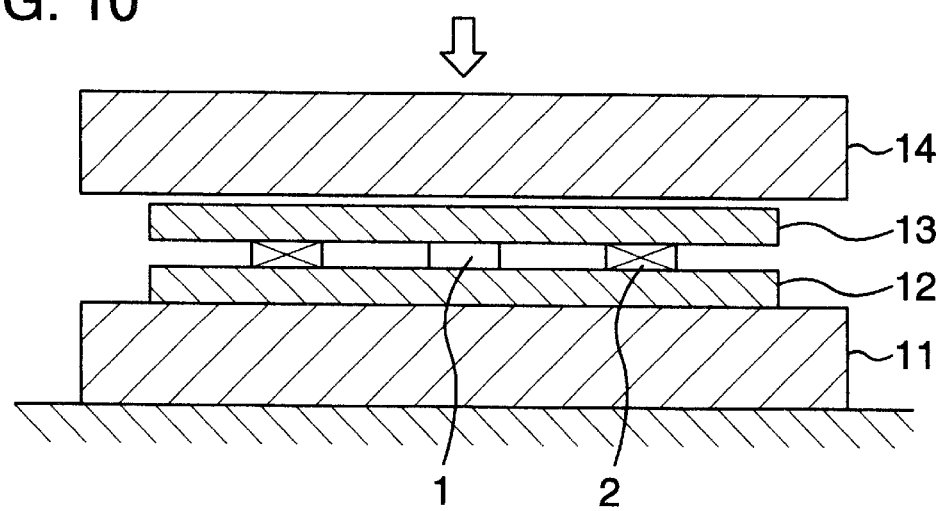
FIG. 10 is a diagram showing the first example of a method for the production of a flexible IC module.

Method for the production of the above-mentioned flexible IC module of the first example will be explained referring to FIG. 10. FIG. 10 explains the method for the production of the flexible IC module.

Prior to the production of flexible IC module, a first nonwoven fabric and a second nonwoven fabric of a given shape and a given size which have compressibility in the thickness direction, self-pressure bonding property and resin impregnation property are prepared. Simultaneously, an IC chip 1 in which both the ends of coil 2 are directly connected to input and output terminals 1a is prepared (see FIG. 3).

Thereafter, as shown in FIG. 10, a first nonwoven fabric 12 having self-pressure bonding property is put on a bottom force 11 having a smooth and flat upper surface, and the IC chip 1 and the coil 2 which are connected are positioned and placed on the first nonwoven fabric 12. Then, a second nonwoven fabric 13 having self-pressure bonding property is superposed over these IC chip 1 and coil 2, and thereafter a top force 14 having a smooth and flat under surface is pressed onto the second nonwoven fabric 13 to compress the first and second nonwoven fabrics 12 and 13 in the thickness direction under heating. Thus, the desired flexible IC module is obtained. In the following explanation, a method of compressing the constitutive parts of the flexible IC module by the bottom force and top force in the thickness direction under heating will be referred to as "hot pressing". The surface of the resulting flexible IC module can be subjected to desired printing.

When the first and second nonwoven fabrics 12 and 13 are uniformly compressed in the thickness direction, these first and second nonwoven fabrics 12 and 13 are compressed much more in the portions at which the IC chip 1 and the coil 2 are set. Therefore, dents 15 in conformity with the outer shape of the IC chip 1 and the coil 2 are formed on the inner surface of the nonwoven fabrics 12 and 13, and the IC chip 1 and the coil 2 are embedded in the dents 15 as shown in FIG. 2. Furthermore, since nonwoven fabrics having self-pressure bonding property are used as the first and second nonwoven fabrics 12 and 13 which form the flexible substrate 3, the shape as shown in FIG. 2 is retained after removing the compressive force. Moreover, by adjusting the compressibility of the first and second nonwoven fabrics 12 and 13 to a proper range of less than 100%, the first and second nonwoven fabrics 12 and 13 can be impregnated with resin after production of flexible IC module, and hence the module can be applied to the production of information carriers.

According to the method of this example, the desired flexible IC module can be obtained only by previously preparing the first and second nonwoven fabrics 12 and 13 and the bonded IC chip 1 and coil 2 which are necessary for the production of the flexible IC module, successively stacking these members and parts and then compressing the resulting laminate in the thickness direction, and, therefore, the flexible IC modules can be produced at a very high efficiency. Furthermore, since both ends of the coil 2 are directly connected to the input and output terminals 1a of the IC chip 1, the flexible IC module can be made thin.

If the second nonwoven fabric 13 is omitted in the method of production shown in FIG. 10, a flexible IC module of the second example can be produced.

The Second Example of the Method for the Production of Flexible IC Module

The second example of the method for the production of the flexible IC module having the above construction will be explained referring to FIGS. 11A–D.

Figure 11A:
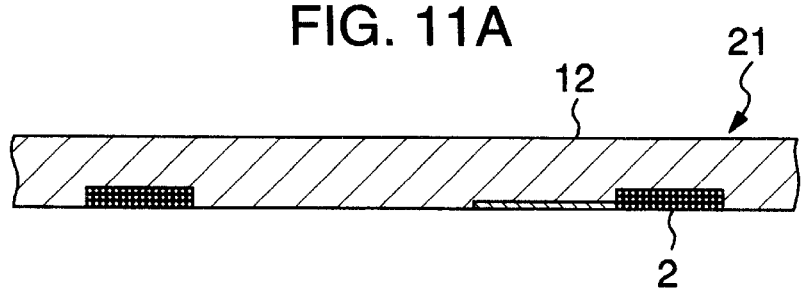
FIGS. 11A, 11B, 11C and 11D are diagrams showing the second example of a method for the production of a flexible IC module.

First, as shown in FIG. 11A, a first intermediate 21 comprising a first nonwoven fabric 12 in one side of which is embedded a coil 2 is prepared. This first intermediate 21 can be produced by putting the first nonwoven fabric 12 having self-pressure bonding property on a bottom force having a smooth and flat upper surface, positioning and putting the coil 2 on the first nonwoven fabric 12, then pressing a top force having a smooth and flat lower surface over the coil 2, and hot pressing them. When coil 2 is put on the first nonwoven fabric 12, the both ends of the coil 2 are set in parallel with each other so that the distance between the both ends of the coil 2 is nearly the same as set between the input and output terminals 1a provided on the IC chip 1 used.

Figure 11B:
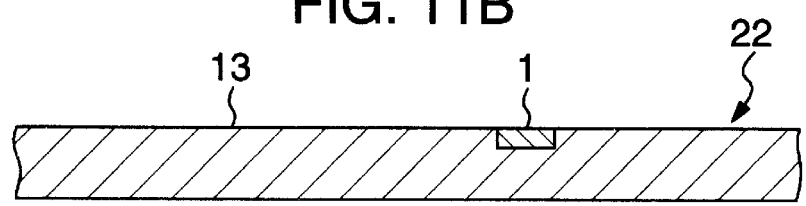
Figure 11C:
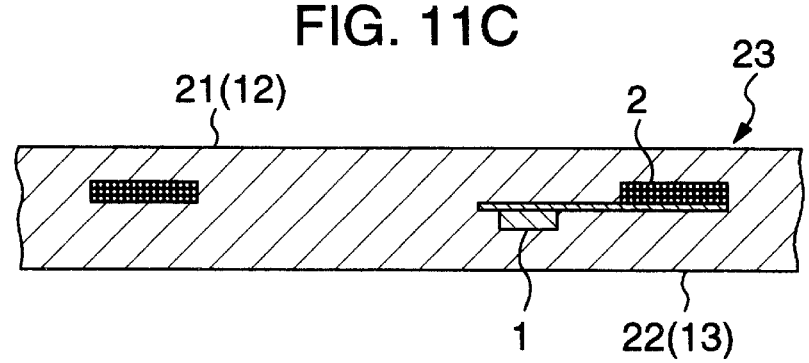

Simultaneously, as shown in FIG. 11B, a second intermediate 22 comprising a second nonwoven fabric 13 in one surface of which is embedded an IC chip 1 is prepared. This second intermediate 22 can be produced by putting the second nonwoven fabric 13 having self-pressure bonding property on a bottom force having a smooth and flat upper surface, positioning and putting the IC chip 1 on the second nonwoven fabric 13, then pressing a top force having a smooth and flat lower surface over the IC chip 1, and hot pressing them. In this case, the IC chip 1 is provided facing upward in second nonwoven fabric 13 so that the input and output terminals 1a are exposed on the surface of the second nonwoven fabric 13.

Then, as shown in FIG. 1C, the first and second intermediates 21 and 22 are superposed so that the side of the IC chip 1 and the side of the coil 2 face each other and the input and output terminals 1a of the IC chip 1 contact with the both end portions of the coil 2, and they are again hot pressed using bottom force 11 and top force 14, whereby a third intermediate 23 is produced which comprises the first and second nonwoven fabrics 12 and 13, the IC chip 1 and the coil 2 which are integrated.

Figure 11D:
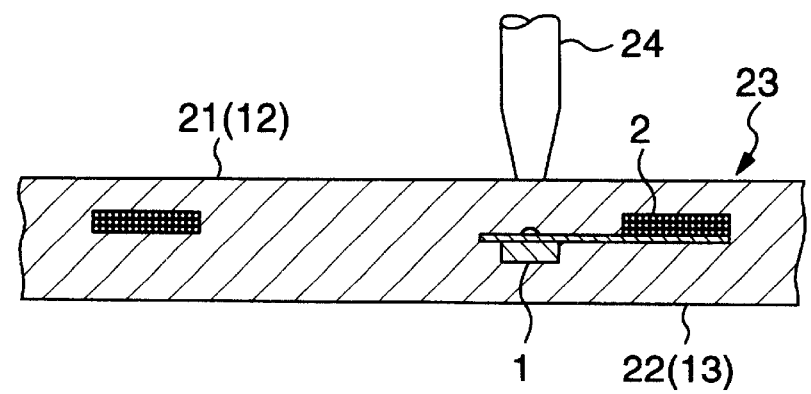

Finally, as shown in FIG. 11D, an ultrasonic vibrator 24 is pressed to the portion of the outer surface of the first nonwoven fabric 12 having the coil 2 which corresponds to the position of the input and output terminals 1a of the IC chip 1, thereby to apply ultrasonic, and the insulating layer and the metal layer of low melting point which cover the wire of the coil are molten by the pressing force and the heat generated by the application of ultrasonic, whereby the input and output terminals 1a and the both end portions of the coil 2 are electrically connected with each other. Thus, the desired flexible IC module is obtained.

In the method for the production of flexible IC module according to this example, since both end portions of the coil 2 are previously fixed at a given interval on the first nonwoven fabric 12, the electrical connection with the IC chip 1 can be very easily performed. That is, some of the IC chips 1 used for the production of flexible IC modules have very small input and output terminals of about 100 μm in side. On the other hand, the wire diameter of coil 2 is about 50 μm. Therefore, it is difficult to efficiently produce a connected portion of the IC chip 1 and the coil 2 without fixing the ends of the coil. The production efficiency can be increased to some extent by using a special jig or an IC chip in which the input and output terminals are extended, but the production steps become complicated and it is difficult to markedly enhance the production efficiency. According to the method of this example, coil 2 is fixed to the nonwoven fabric which is a constitutive part of the flexible IC module, and hence the production steps are not complicated and non-defective products can be obtained at a high efficiency.

The Third Example of the Method for the Production of Flexible IC Module

Next, the third example of the method for the production of the flexible IC module having the above construction will be explained referring to FIGS. 12A–12D.

Figure 12A:
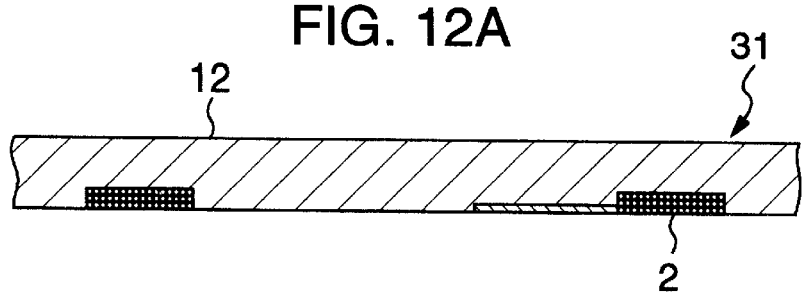
FIGS. 12A, 12B, 12C and 12D are diagrams showing the third example of a method for the production of a flexible IC module.

First, as shown in FIG. 12A, a first stage intermediate 31 comprising a first nonwoven fabric 12 in one side of which is embedded a coil 2 is prepared. This first stage intermediate 31 can be produced by placing the first nonwoven fabric 12 having self-pressure bonding property on a bottom force having a smooth and flat upper surface, positioning and placing the coil 2 on the first nonwoven fabric 12, then pressing a top force having a smooth and flat under surface over the coil 2, and hot pressing them. When coil 2 is placed on the first nonwoven fabric 12, the both ends of the coil 2 are set in parallel with each other so that the distance between the both ends of the coil 2 is nearly the same as the distance set between the input and output terminals 1a provided at the IC chip 1. These steps are the same as in the production of the first intermediate 21 in the second example.

Figure 12B:
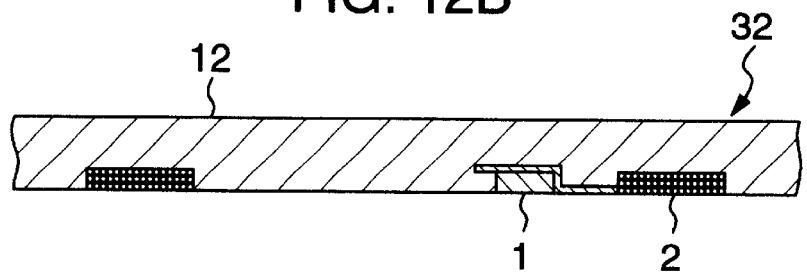

Then, as shown in FIG. 12B, a second stage intermediate 32 comprising the first nonwoven fabric 12 in one side of which are embedded the coil 2 and the IC chip 1 is produced by embedding the IC chip 1 in the first stage intermediate 31. This second stage intermediate 32 can be produced by placing the first stage intermediate 31 with the coil 2-embedded side facing upward on a bottom force having a smooth and flat upper surface, positioning and placing the IC chip 1 on the portion of the first stage intermediate 31 at which are set the both ends of the coil 2 embedded so that the input and output terminals 1a face downward and the input and output terminals 1a meet with the both ends of the coil 2, then pressing a top force having a smooth and flat under surface over the IC chip 1 and again hot pressing them.

Figure 12C:
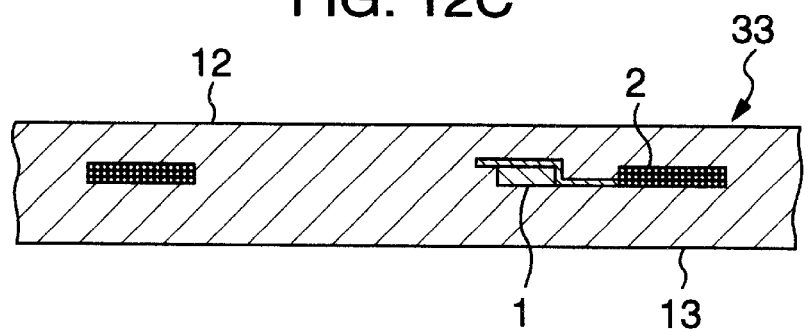

Furthermore, as shown in FIG. 12C, a second nonwoven fabric 13 is superposed on the side of the second stage intermediate 32 in which the IC chip 1 and the coil 2 are embedded, and the resulting laminate is again hot pressed by the bottom force 11 and the top force 14, thereby to obtain a third intermediate 33 comprising the first and second nonwoven fabrics 12 and 13, the IC chip 1 and the coil 2 which are integrated.

Figure 12D:
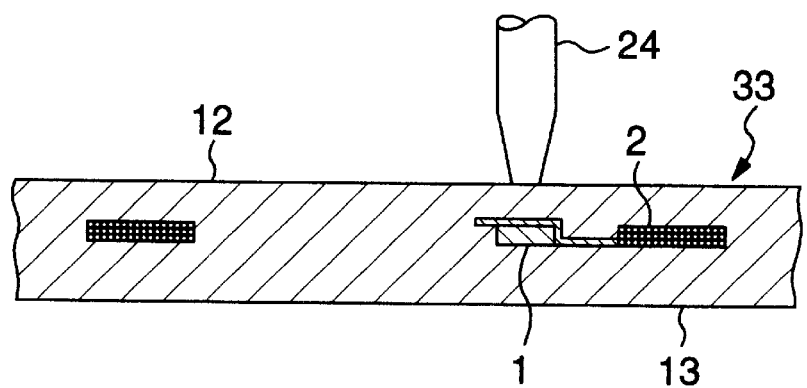

Finally, as shown in FIG. 12D, an ultrasonic vibrator 24 is pressed to the portion of the outer surface of the first nonwoven fabric 12 having the coil 2 which corresponds to the position of the input and output terminal portions 1a of the IC chip 1, thereby to apply ultrasonic, and the insulating layer and the metal layer of low melting point covering the wire of the coil are molten by the pressing force and the heat generated by the application of ultrasonic, whereby the input and output terminal portions 1a and the both end portions of the coil 2 are electrically connected with each other. Thus, the desired flexible IC module of completely embedding type is obtained.

The method of this example also has the same effects as of the method in the above second example.

After the production of the second stage intermediate 32 shown in FIG. 12B, if the input and output terminal portions 1a of the IC chip 1 are electrically connected with the both end portions of the coil 2, a flexible IC module of one side-embedding type can be produced.

Moreover, in the above examples, the flexible substrate 3 comprises a nonwoven fabric, but flexible IC modules can also be produced in the similar method using woven fabric, knitted fabric, paper, leather or the like.

Furthermore, in the above examples, explanation has been made of flexible IC modules in which IC chip 1 and coil 2 are embedded as parts to be mounted, but flexible IC modules in which other parts to be mounted are embedded can also be produced by the similar method.

Next, explanation will be made of a method for producing a desired contactless IC card using the flexible IC module produced in the above-mentioned manner.

The First Example of the Method for the Production of a Contactless IC Card

Figure 13A:
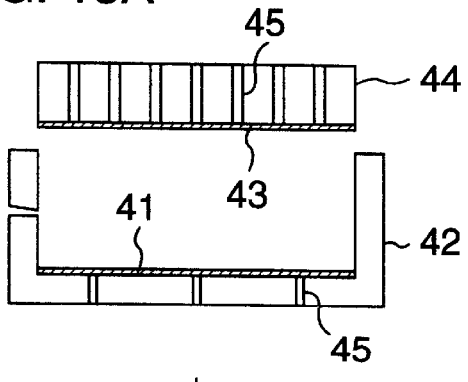
FIGS. 13A, 13B, 13C, 13D and 13E are diagrams showing the first example of a method for the production of an IC card.

First, as shown in FIG. 13A, a first cover sheet 41 is disposed at a stationary mold 42 of an injection molding machine and simultaneously a second cover sheet 43 is disposed at a movable mold 44 of the injection molding machine. In this case, as shown in this FIG. 13A, it is also possible to bring the cover sheets 41 and 43 into close contact with the molds 42 and 44 by sucking the cover sheets utilizing venting holes 45 bored through the stationary mold 42 and the movable mold 44.

The cover sheets 41 and 43 can comprise any of known optional transparent or opaque synthetic resin sheets as far as they have a desired heat resistance, but especially preferably comprise synthetic resin sheets which do not generate chlorine gas upon thermal disposal, such as polyethylene terephthalate (hereinafter referred to as "PET") and polyethylene naphthalate for the prevention of environmental pollution. The desired printing can be carried out on the front side or back side of the cover sheets 41 and 43.

In order to enhance the adhesion to the substrate 3, it is preferred to form fine irregularities on the back side of the cover sheets 41 and 43, and the irregularities are, for example, those corresponding to an abrasive grain size of #400–1000 specified in JIS. Furthermore, when the front side of the cover sheets 41 and 43 is subjected to direct printing, it is preferred for enhancing the printability to form fine irregularities also on the front side of the cover sheets 41 and 43. In this case, in order to improve receptivity of ink and enhance printability, the irregularities formed on the front side of the cover sheets 41 and 43 are preferably those corresponding to an abrasive grain size of #3000–10000 specified in JIS. Such cover sheets can be produced, for example, by a method of embedding a filler of 0.1 $\mu$m to several ten $\mu$m in diameter (e.g., abrasive grains) in a raw sheet of the cover sheet by electrostatic deposition, a method of kneading the filler with the material of the cover sheet, and a method of abrading the surface of a raw sheet with abrasive grains.

Figure 13B:
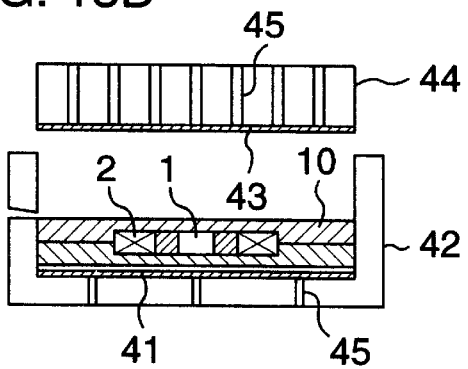

Then, as shown in FIG. 13B, a flexible IC module 10 produced as mentioned above is superposed on the first cover sheet 41 disposed in the stationary mold 42.

Figure 13C:
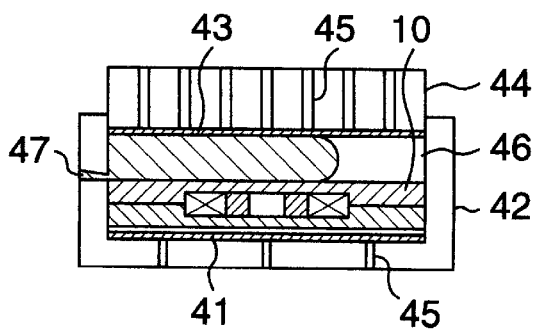

After the stationary mold 42 and the movable mold 44 are closed, a resin is filled into the cavity 46 formed by the molds 42 and 44 from gate 47 as shown in FIG. 13C. As aforementioned, the substrate 3 of the flexible IC module 10 comprises a nonwoven fabric having a property capable of being impregnated with resin and, hence, is impregnated with the resin filled in the cavity 46.

Figure 13D:
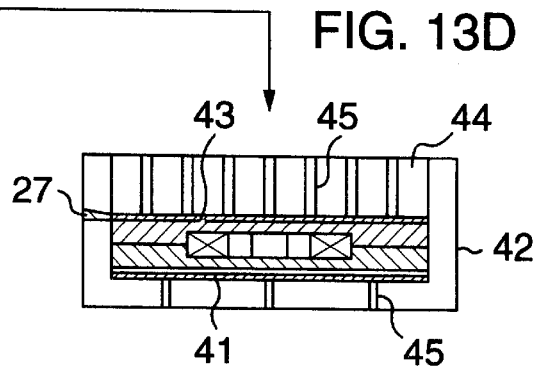

Then, as shown in FIG. 13D, a contactless IC card of a given shape and a given size is molded by increasing the pressing force of the movable mold 44. Simultaneously, the gate 47 is cut by the movable mold 44.

Figure 13E:
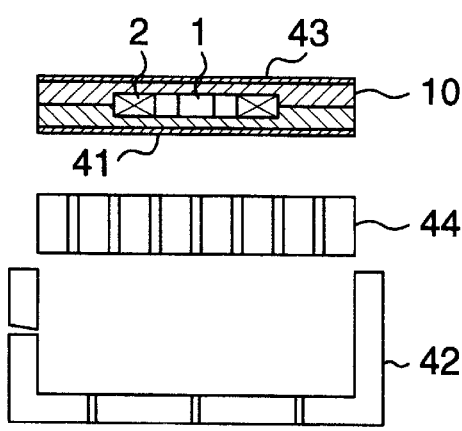

Finally, as shown in FIG. 13E, the molds 42 and 44 are opened, and a contactless IC card comprising the first and second cover sheets 41 and 43 and the flexible IC module 10 which are integrated is taken out.

According to the method for the production of information carriers of this example, bonding of the parts to be mounted (IC chip 1 and coil 2) to the first and second cover sheets 41 and 43 can be omitted and thus the production of contactless IC cards can be performed efficiently. Furthermore, since the heat load applied to the cover sheets 41 and 43 at the time of filling of the resin can be uniformized, wrinkling of the cover sheets 41 and 43 caused by non-uniform heat load can be prevented. Therefore, contactless IC cards of high quality can be produced at a high efficiency and, besides, design printing of improved quality can be performed. Moreover, since the flexible IC module 10 comprises the first and second nonwoven fabric between which the parts to be mounted are sandwiched, setting of the position of the parts to be mounted, in the thickness direction of the contactless IC card, can be optionally adjusted by adjusting the thickness of each nonwoven fabric. In addition, since the parts to be mounted are held by the substrate 3, the protective effect for the mounted parts can be enhanced.

This method requires no complicated steps of conventional technique such as of providing a cut hole in the substrate, storing the parts in the hole and sealing the hole with resin, and, as a result, contactless IC cards of the desired shapes can be cheaply produced.

The Second Example of the Method for the Production of Contactless IC Card

The method of this example is a method for producing a contactless information carrier having no cover sheet by so-called hot pressing method.

Figure 14:
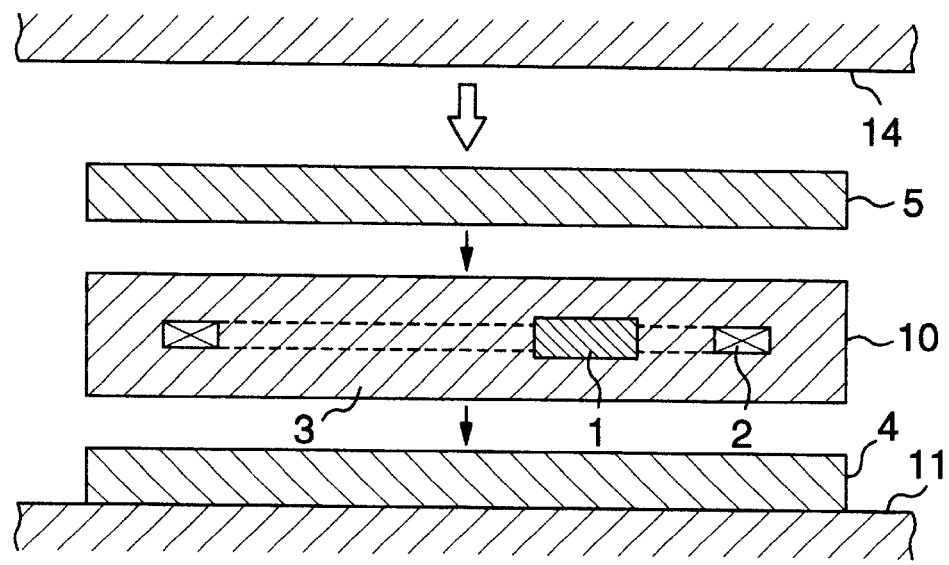
FIG. 14 is a diagram showing the second example of a method for the production of an IC card.

That is, as shown in FIG. 14, a first heat-meltable sheet 4 comprising a thermoplastic resin such as PET, a previously prepared flexible IC module 10 and a second heat-meltable sheet 5 comprising a thermoplastic resin same as or different from the first heat-meltable sheet 4 are stacked in this order on the upper surface of a bottom force 11 in the form of a flat plate, and a top force 14 in the form of a flat plate is lowered over the second heat-meltable sheet 5 to compress the laminate under the desired heating and pressing conditions. In the course of this compressing, the first and second heat-meltable sheets 4 and 5 are molten, and a part or the whole of the melt is impregnated into the flexible substrate 3 constituting the flexible IC module 10. In this way, the flexible IC module 10 and the first and second heat-meltable sheets 4 and 5 are integrated, and the flexible IC module 10 is cased with the first and second heat-meltable sheets 4 and 5. Then, if required, the shape of the outer peripheral portion is adjusted and the surface of the heat-meltable sheet is subjected to design printing to obtain a contactless information carrier which is the desired product.

In FIG. 14, the method of hot pressing the contactless information carrier one by one is shown for easy illustration. However, it is also possible to hot press a number of contactless information carriers at the same time by using a flexible IC module 10 comprising a large-sized flexible substrate in which a number of parts to be mounted are embedded at given intervals.

The method for the production of contactless information carriers according to this example performs casing of the flexible IC module 10 by so-called hot pressing method, and hence the heating conditions and the compressing conditions for the casing can be easily controlled, and thus contactless information carriers of high precision can be produced.

The Third Example of the Method for the Production of Contactless IC Card

The method of this example is a method for producing a contactless information carrier having cover sheets by so-called hot pressing method.

Figure 15:
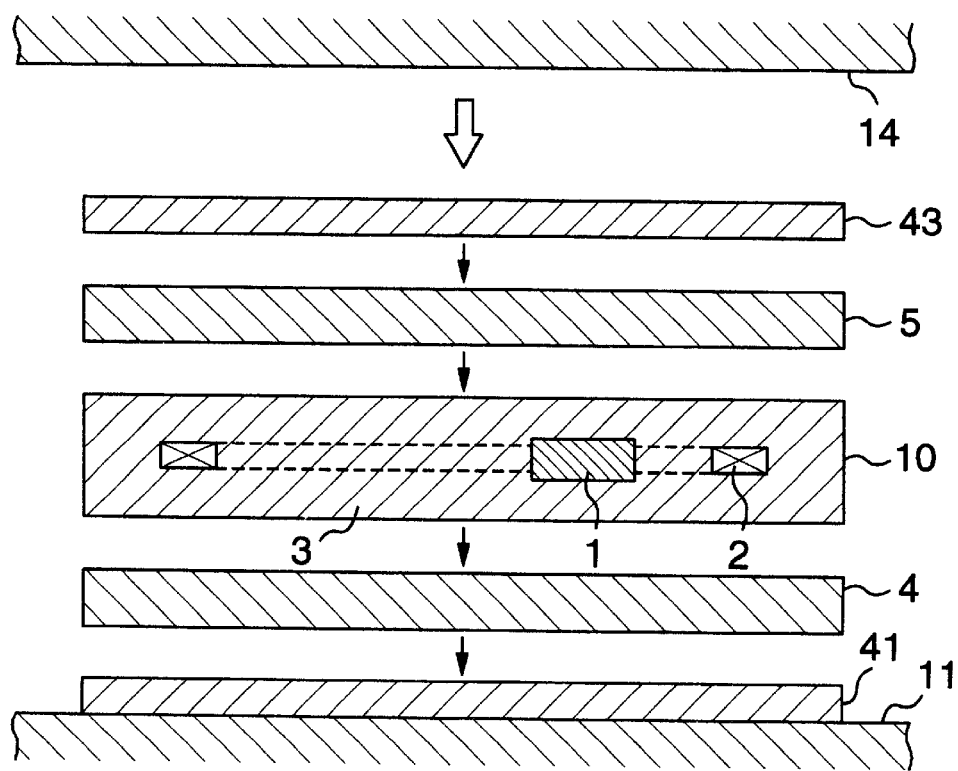
FIG. 15 is a diagram showing the third example of a method for the production of an IC card.

That is, as shown in FIG. 15, a first cover sheet 41 comprising a resin material excellent in heat resistance, such as polyvinyl chloride (hereinafter referred to as "PVC"), a first heat-meltable sheet 4 comprising a thermoplastic resin such as PET, a previously prepared flexible IC module 10, a second heat-meltable sheet 5 comprising a thermoplastic resin same as or different from the first heat-meltable sheet 4 and a second cover sheet 43 comprising a heat resistant resin same as or different from the first cover sheet 41 are stacked in this order on the upper surface of a bottom force 11 in the form of a flat plate, and a top force 14 in the form of a flat plate is lowered over the second cover sheet 43 to compress the laminate under the desired heating and pressing conditions. In the course of this compressing, the first and second heat-meltable sheets 4 and 5 are molten, and a part of the melt is impregnated into the flexible substrate 3 constituting the flexible IC module 10, and simultaneously the first and second cover sheets 41 and 43 are bonded to the first and second heat-meltable sheets 4 and 5. Thus, the flexible IC module 10, the first and second heat-meltable sheets 4 and 5, and the first and second cover sheets 41 and 43 are integrated, and the flexible IC module 10 is cased.

Then, if required, the shape of the outer peripheral portion is regularized and the surface of the heat-meltable sheets is subjected to design printing to obtain a contactless information carrier which is the desired product. In this example, too, by using a flexible IC module 10 of the desired construction and size, a number of contactless information carriers can be simultaneously obtained by one hot pressing. The method for producing the contactless information carriers of this example also has the same effects as of the method for the production of contactless information carriers shown in FIG. 14.

The Fourth Example of the Method for the Production of Contactless IC Card

The method of this example is a method for producing a contactless information carrier having no cover sheets by so-called roll pressing method.

Figure 16:
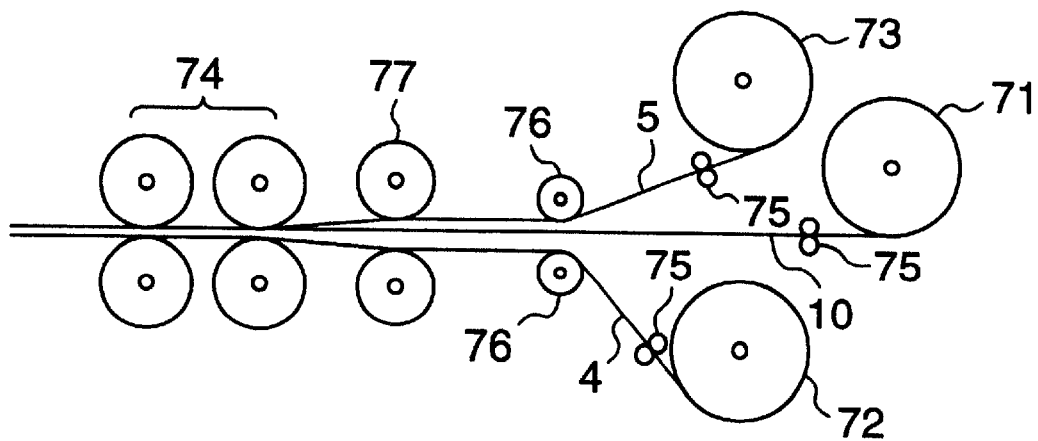
FIG. 16 is a diagram showing the fourth example of a method for the production of an IC card.

That is, as shown in FIG. 16, a flexible IC module 10 comprising a tape-like flexible substrate in which a number of parts to be mounted are embedded at given intervals, a first tape-like heat-meltable sheet 4 comprising a thermoplastic resin such as PET, and a second tape-like heat-meltable sheet 5 comprising a thermoplastic resin same as or different from the first heat-meltable sheet 4 are separately wound on rollers 71, 72 and 73, respectively. The first heat-meltable sheet 4 and the second heat-meltable sheet 5 drawn off from the rollers 72 and 73 are laminated on the front side and the back side of the flexible IC module 10 drawn off from the roller 71, and then this laminate is passed through heating and pressing rollers 74 to compress it. In FIG. 16, the numeral 75 indicates take-off rollers, 76 indicates guide roller, and 77 indicates laminating rollers.

In the course of passing the laminate through the heating and pressing rollers 74, the first and second heat-meltable sheets 4 and 5 are molten, and a part or the whole of the melt is impregnated into the flexible substrate constituting the flexible IC module 10. Thus, the flexible IC module 10 and the first and second heat-meltable sheets 4 and 5 are integrated, and the flexible IC module 10 is cased with the first and second heat-meltable sheets 4 and 5. Then, design printing on the laminate is carried out, followed by cutting the laminate to obtain the desired contactless information carrier which is the desired product.

According to the method for the production of contactless information carriers of this example, casing of the flexible IC module 10 is conducted by so-called roll pressing method. Therefore, the casing step for the contactless information carrier can be made more efficient as compared with the casing of flexible IC module 10 by so-called hot pressing method, and the production cost for contactless information carriers can be reduced.

The Fifth Example of the Method for the Production of Contactless IC Card

The method of this example is a method for producing a contactless information carrier having cover sheets by so-called roll pressing method.

Figure 17:
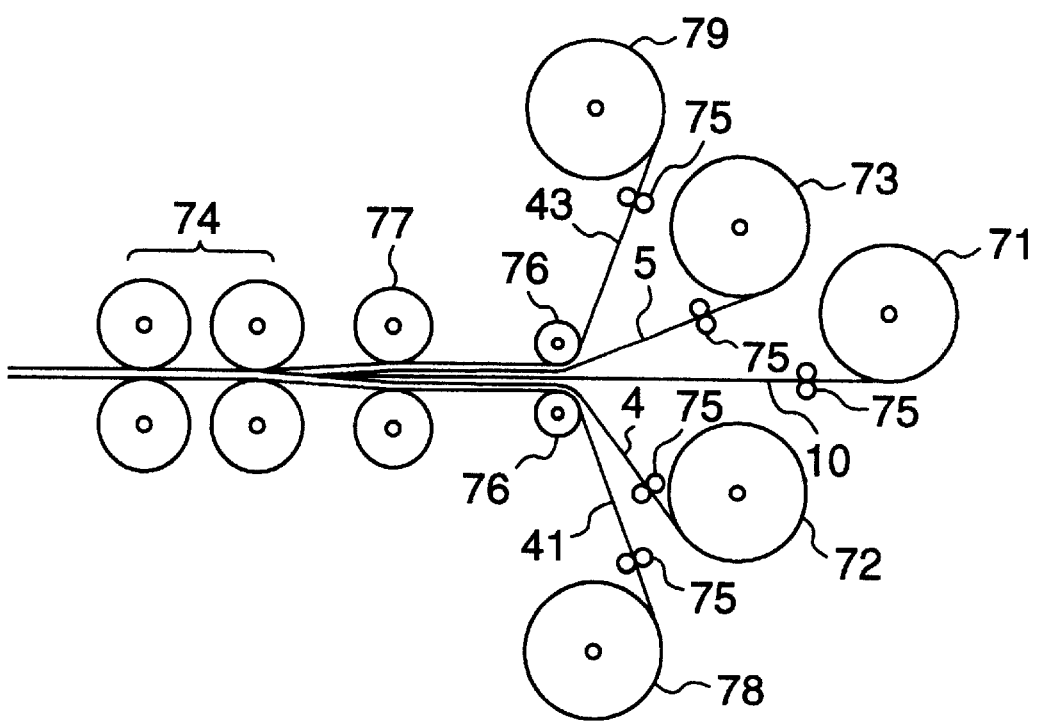
FIG. 17 is a diagram showing the fifth example of a method for the production of an IC card.

That is, as shown in FIG. 17, a flexible IC module 10 comprising a tape-like flexible substrate in which a number of parts to be mounted are embedded at given intervals, a first tape-like heat-meltable sheet 4 comprising a thermoplastic resin such as PET, a second tape-like heat-meltable sheet 5 comprising a thermoplastic resin same as or different from the first heat-meltable sheet 4, and tape-like cover sheets 41 and 43 comprising a resin material excellent in heat resistance such as PVC are separately wound on rollers 71, 72, 73, 78 and 79, respectively. The first heat-meltable sheet 4 and the second heat-meltable sheet 5 drawn off from the rollers 72 and 73 are laminated on the front side and the back side of the flexible IC module 10 drawn off from roller 71, and, furthermore, the first cover sheet 41 and the second cover sheet 43 drawn off from the rollers 78 and 79 are laminated on the surface of the first heat-meltable sheet 4 and on the surface of the second heat-meltable sheet 5, respectively. Then this laminate is passed through heating and pressing rollers 74 to compress it. In FIG. 17, too, the numeral 75 indicates take-off rollers, 76 indicates a guide roller, and 77 indicates laminating rollers.

According to the method of FIG. 17, in the course of passing the laminate through the heating and pressing rollers 74, the first and second heat-meltable sheets 4 and 5 are molten, and a part of the melt is impregnated into the flexible substrate constituting the flexible IC module 10, and the flexible IC module 10 and the first and second heat-meltable sheets 4 and 5 are integrated. Simultaneously, the first and second cover sheets 41 and 43 are bonded by the first and second heat-meltable sheets 4 and design printing and cutting of the laminate are carried out to obtain a flexible information carrier which is the desired product.

The method for the production of contactless information carriers of this example also has the same effect as the method for the production of contactless information carriers shown in FIG. 16.

Other examples of the present invention will be enumerated below.

①　In the above examples the flexible substrate 3 comprised a nonwoven fabric. However, contactless IC cards can also be produced by the similar methods using woven fabric, knitted fabric, paper, leather or the like.

②　In the above examples, contactless IC cards were produced using a flexible IC module comprising a substrate 3 in which IC chip 1 and coil 2 were embedded. However, contactless IC cards can also be produced by the similar methods using a flexible IC module comprising a substrate 3 in one side of which the IC chip 1 and the coil 2 are embedded.

③　In the above examples, explanation has been made of flexible IC modules having an IC chip 1 and a coil 2 embedded therein as the parts to be mounted. However, contactless IC cards can also be produced by the similar methods in the case of using flexible IC modules in which other parts are embedded.

④　In the above examples, explanation has been made of contactless IC cards, but naturally it is also easy to construct contactless IC information carriers of other shapes such as coin and ribbon.

⑤　With regard to the method for direct connection of IC chip and coil, in addition to those exemplified in the above examples, it is also possible to employ a method of connection of the IC chip and the coil through an electrically conductive resin.

⑥　The above examples have explained a method for the connection of input and output terminals 1a of the IC chip 1 and coil 2 which comprises carrying out the bonding by a bonding tool using a wire in which core wire 2a or bonding metal layer 2c are covered with insulating layer 2b and connecting the input and output terminals 1a of the IC chip 1 to the coil 2 with carrying out carbonization and removal of the insulating layer 2b with the energy given by the bonding tool. This method can be applied not only to the connection of the input and output terminals 1a of the IC chip 1 with the coil 2, but also to the connection of a jumper wire to a wiring substrate or connection of a coil in a magnetic head.

INDUSTRIAL APPLICABILITY

In the flexible IC module of the present invention, the parts to be mounted are embedded in a flexible substrate comprising a nonwoven fabric or the like, and hence the protecting effect for the mounted parts is excellent and besides it becomes easy to handle the parts to be mounted, especially, small IC chips or coils of low stiffness in the production of contactless IC cards and the like. Furthermore, since the substrate is very high in flexibility, the modules can be used not only as a constitutive part of contactless IC cards in the form of flat plate, but also widely as an information carrier provided at a curved portion or a portion subjected to deformation repeatedly. Moreover, since the IC chip is directly connected to the coil, use of wiring substrate can be omitted and thickness of the flexible IC modules, namely, the final contactless IC cards can be decreased and besides the cost can also be reduced. Especially, when the IC chip and the coil are directly connected by soldering method or welding method, the reliability of connection can also be enhanced.

According to the method of the present invention, flexible IC modules can be produced only by positioning and placing the parts to be mounted, between nonwoven fabrics having compressibility in the thickness direction, self-pressure bonding property and resin impregnation property or on one side of the nonwoven fabric, followed by hot pressing them. Therefore, contactless IC cards and others which are final products can be produced at a low cost.

Among the methods for the production of information carriers according to the present invention, the method in which a resin is filled in a cavity of mold with a flexible IC module disposed therein can omit bonding of the parts to be mounted to cover sheets, and therefore production of the information carriers can be performed efficiently. Moreover, since heat load applied to cover sheets at the time of filling of resin can be made uniform, wrinkling of the cover sheets caused by non-uniform heat load can be inhibited. Thus, information carriers of high quality can be produced at a high efficiency and, besides, quality of design printing can be improved. Furthermore, since filling of resin is carried out while the parts to be mounted which are held by the flexible substrate are present between two cover sheets, the position of the mounted parts in the thickness direction of the information carrier can be properly adjusted by adjusting the thickness of the flexible substrate. In addition, since the mounted parts are held by the flexible substrate, the effect of protecting the mounted parts can be enhanced. Of course, since nonwoven fabric or the like which has resin impregnation property is used as the substrate material, the resin can be rapidly filled to cause no decrease of the injection molding cycle.

Among the methods for the production of information carriers according to the present invention, the method of casing a previously produced flexible IC module by hot pressing method has the same effects on the quality of the information carrier as a final product as the resin filling method, and, in addition, the method can be practiced by simple production facilities and further is superior in mass-productivity.

Among the methods for the production of information carriers according to the present invention, the method of casing a previously produced flexible IC module by roll pressing method has the same effects on the quality of information carrier as a final product as the resin filling method, and, in addition, the method can perform lamination of the respective members automatically and continuously and thus is further superior in mass-productivity.

What is claimed is:

1. A flexible IC module which comprises a flexible substrate of a predetermined shape and a predetermined size having compressibility in the thickness direction, a self-pressure bonding property and a resin impregnation property and a mounted part supported by said flexible substrate, said mounted part being embedded in a dent formed by compression in a portion of the flexible substrate and said mounted part comprising an IC chip and a contactless transmission coil for data and/or electric source which is directly connected to input and output terminals of the IC chip, and wherein the coil comprises a wire having a diameter of 20–100 $\mu$m.

2. The flexible IC module according to claim 1, wherein the mounted part is embedded in the flexible substrate, and the front and back sides of the flexible substrate are formed in a plane.

3. The flexible IC module according to claim 1, wherein the part to be mounted is embedded in one side of the flexible substrate, and the front and back sides of the flexible substrate which include the surface of the embedded parts are formed in a plane.

4. The flexible IC module according to claim 1, wherein the flexible substrate comprises a woven fabric, a knitted fabric or a nonwoven fabric which per se has self-pressure bonding property.

5. The flexible IC module according to claim 1, wherein the mounted part is at least one member selected from the group consisting of an IC chip, an IC module, a contactless transmission means for data and/or electric source, a condenser, a resistor, a solar battery, liquid crystal displace device, an image display device, an optical recording medium, an optical magnetic recording medium, a transparent code information display device formed using an infrared absorber, an infrared emitter or a phosphor, a magnet a ferromagnet and combinations of these members.

6. The flexible IC module according to claim 1, wherein the input and output terminals of the IC chip and both end portions of the contactless transmission coil are directly connected by a wedge bonding method, a soldering method or a welding method.

7. The flexible IC module according to claim 6, wherein the contactless transmission coil comprises a core wire, a bonding metal layer which covers the core wire, and an insulating layer which covers the bonding metal layer.

8. The flexible IC module according to claim 1, wherein a circuit pattern is printed on the portion of the flexible substrate in which the part is mounted and the circuit pattern is electrically connected with the mounted part.

9. The flexible IC module according to claim 8, wherein a coil for contactless transmission of data and/or electric source is formed by printing as the circuit pattern.

10. A method for producing a flexible IC module which comprises positioning and disposing a desired part to be mounted between a first flexible substrate and a second flexible substrate of a predetermined shape and a predetermined size having compressibility in the thickness direction, a self-pressure bonding property and a resin impregnation property, compressing the first and second flexible substrates in the thickness direction at room temperature or with heating to integrate these first and second flexible substrates by the compressive force and simultaneously embedding the part in a dent formed in a portion of the first and second flexible substrates by applying compressive force, wherein said part to be mounted comprises an IC chip and a contactless transmission coil directly connected to input and output terminals of the IC chip, said IC chip and coil being positioned and disposed at a predetermined portion of the flexible substrate, and wherein the coil comprises a wire having a diameter of 20–100 $\mu$m.

11. A method for producing a flexible IC module which comprises positioning and disposing a desired part to be mounted on one side of a flexible substrate of a predetermined shape and a predetermined size having compressibility in the thickness direction, a self-pressure bonding property and a resin impregnation property, and compressing the flexible substrate in the thickness direction at room temperature or with heating to embed the part in the dent formed in a portion of the flexible substrate by the compressive force applied, wherein said part to be mounted comprises an IC chip and a contactless transmission coil directly connected to input and output terminals of the IC chip, said IC chip and coil being positioned and disposed at a predetermined portion of the flexible substrate, and wherein the coil comprises a wire having a diameter of 20–100 $\mu$m.

12. The method for producing a flexible IC module according to claim 10, wherein the input and output terminals of the IC chip and the both end portions of the contactless transmission coil are directly connected by previously forming solder bumps at the input and output terminals of the IC chip, pressing a bonding tool to the both end portions of the contactless transmission coil in the state of the both end portions of the contactless transmission coil being allowed to contact with the solder bumps, and melting the solder bumps with the energy given by the bonding tool, thereby directly connecting the input and output terminals of the IC chip and both end portions of the contactless transmission coil.

13. A method for producing a flexible IC module which comprises:

positioning and disposing an IC chip on one side of a first flexible substrate of a predetermined shape and a predetermined size having compressibility in a thickness direction, a self-pressure bonding property and a resin impregnation property, positioning and disposing a contactless transmission coil for data and/or electric source on one side of a second flexible substrate comprising a material same as or different from that of the first flexible substrate and setting both end portions of the coil at a distance set between the input and output terminals of the IC chip, superposing the first and second flexible substrates one upon another so that the IC chip-disposed side faces the coil-disposed side and the input and output terminals of the IC chip contact with both end portions of the coil, compressing the first and second flexible substrates in the thickness direction at room temperature or under heating to integrate these first and second flexible substrates by the compressive force and simultaneously embedding the part in the dent formed in a portion of the first and second flexible substrates by applying compressive force, and applying heat and pressing force to the input and output terminal portions from the outer surface of the second flexible substrate having the coil to electrically connect the input and output terminal portions and both end portions of the coil, and wherein the coil comprises a wire having a diameter of 20–100 $\mu$m.

14. A method for producing a flexible IC module which comprises:

positioning and disposing a contactless transmission coil for data and/or electric source on one side of a first flexible substrate of a predetermined shape and a predetermined size, having compressibility in a thickness direction, a self-pressure bonding property and resin impregnation property, and setting both end portions of the coil at a distance between the input and output terminals of an IC chip, disposing the IC chip on one side of the flexible substrate while allowing the input and output terminals to contact with both ends of the coil, compressing the flexible substrate in the thickness direction at room temperature or under heating to embed the IC chip and the coil in a dent formed in a portion of the flexible substrate by applying compressive force, and applying heat and pressing force to the input and output terminal portions from outer surface of the flexible substrate having the coil to electrically connect the input and output terminal portions both end portions of the coil, and wherein the coil comprises a wire having a diameter of 20–100 μm.

15. A method for producing an information carrier which comprises:

disposing a first cover sheet and a second cover sheet at the predetermined portion of a stationary mold and a movable mold of a molding apparatus, respectively, superposing a flexible IC module on the cover sheet disposed at the stationary mold or the movable mold, closing the stationary mold and the movable mold and filling a resin in the cavity formed thereby, and uniformly impregnating the flexible substrate with the filled resin, then opening the stationary mold and the movable mold and removing the information carrier which is the desired product.

16. A method for producing an information carrier which comprises:

stacking a first heat-meltable sheet, a flexible IC module and a second heat-meltable sheet in this order on an upper surface of a bottom force, pressing a top force onto the second heat-meltable sheet to compress the laminate of the flexible IC module and the first and second heat-meltable sheets in the thickness direction while heating to melt the first and second heat-meltable sheets, and impregnating the flexible IC module with the melt of the first and second heat-meltable sheets, followed by hot pressing the module to obtain an information carrier of desired thickness.

17. A method for producing an information carrier which comprises:

stacking a first cover sheet, a first heat-meltable sheet, a flexible IC module, a second heat-meltable sheet and an second cover sheet in this order on a upper surface of a bottom force, pressing a top force onto the second cover sheet to compress the laminate of the flexible IC module, the first and second heat-meltable sheets and the first and second cover sheets in the thickness direction under heating, to thereby melt the first and second heat-meltable sheets, and impregnating the flexible IC module with the melt of the first and second heat-meltable sheets and simultaneously bonding the first and second cover sheets with the melt, followed by hot pressing the module to obtain an information carrier of a desired thickness.

18. A method for producing an information carrier which comprises:

drawing from rolls the top ends of a continuous flexible IC module, a first heat-meltable sheet and a second heat-meltable sheet which are wound on the rolls, guiding the flexible IC module and the first and second heat-meltable sheets drawn off from the respective rolls to laminating rolls to laminate individually the first and second heat-meltable sheets on the front side and the back side of the flexible IC module, guiding the laminate of the flexible IC module and the first and second heat-meltable sheets to heating-pressing rolls to compress the laminate in the thickness direction while heating, thereby to melting the first and second heat-meltable sheets, and impregnating the flexible IC module with the melt of the first and second heat-meltable sheets and roll pressing the module to obtain an information carrier of a given thickness.

19. A method for producing an information carrier which comprises:

drawing from rolls the top ends of a continuous flexible IC module, a first heat-meltable sheet, a second heat-meltable sheet, a first cover sheet and a second cover sheet which are wound on the rolls, guiding the flexible IC module, the first and second heat-meltable sheets and the first and second cover sheets drawn off from the respective rolls to laminating rolls to laminate individually the first and second heat-meltable sheets on the front side and the back side of the flexible IC module and to laminate individually the first and second cover sheets on the outer surface of the first and second heat-meltable sheets, guiding the laminate of the flexible IC module, the first and second heat-meltable sheets and the first and second cover sheets to heating-pressing rollers to compressing the laminate in the thickness direction while heating, to thereby melt the first and second heat-meltable sheets, and impregnating the flexible IC module with the melt of the first and second heat-meltable sheets and simultaneously bonding the first and second cover sheets with the melt, and roll pressing the module to obtain an information carrier of a given thickness.

* * * * *